(12) United States Patent
Hu

(10) Patent No.: US 11,349,041 B2
(45) Date of Patent: May 31, 2022

(54) DOUBLE-SIDED LIGHT-CONCENTRATING SOLAR APPARATUS AND SYSTEM

(71) Applicant: BOLY MEDIA COMMUNICATIONS (SHENZHEN) CO., LTD., Guangdong (CN)

(72) Inventor: Xiaoping Hu, Guangdong (CN)

(73) Assignee: BOLY MEDIA COMMUNICATIONS (SHENZHEN) CO., LTD., Shenzhen (CN)

( * ) Notice: Subject to any disclaimer, the term of this patent is extended or adjusted under 35 U.S.C. 154(b) by 12 days.

(21) Appl. No.: 17/052,799

(22) PCT Filed: May 8, 2018

(86) PCT No.: PCT/CN2018/085992
§ 371 (c)(1),
(2) Date: Nov. 3, 2020

(87) PCT Pub. No.: WO2019/213834
PCT Pub. Date: Nov. 14, 2019

(65) Prior Publication Data
US 2021/0249550 A1    Aug. 12, 2021

(51) Int. Cl.
*H01L 31/054* (2014.01)
*F24S 23/30* (2018.01)
*F24S 23/70* (2018.01)

(52) U.S. Cl.
CPC .......... *H01L 31/0547* (2014.12); *F24S 23/31* (2018.05); *H01L 31/0543* (2014.12); *F24S 2023/831* (2018.05)

(58) Field of Classification Search
CPC ... H01L 31/054; H01L 31/0547; H02S 40/20; H02S 40/22; F24S 23/70; F24S 23/30;
(Continued)

(56) References Cited

U.S. PATENT DOCUMENTS

| | | | |
|---|---|---|---|
| 2001/0008144 A1* | 7/2001 | Uematsu | H01L 31/0547 136/246 |
| 2009/0133685 A1* | 5/2009 | Pham | F24S 25/13 126/569 |

(Continued)

FOREIGN PATENT DOCUMENTS

| | | | |
|---|---|---|---|
| CN | 105978471 A | 9/2016 | |
| CN | 206099878 U | 4/2017 | |
| DE | 102007052338 A1 * | 5/2009 | ............ F24S 30/425 |

OTHER PUBLICATIONS

English machine translation of Lagaly (DE 10 2007 052 338) published on May 7, 2009.*

(Continued)

*Primary Examiner* — Christina Chern

(57) ABSTRACT

A double-sided light-concentrating solar apparatus and system. The apparatus comprises a front-side concentrating groove (110), a back-side concentrating groove (110'), and a photovoltaic panel (120) provided at the bottom of each concentrating groove. Each concentrating groove comprises two groove walls (111, 112; 111', 112') extending along the bottom; opposite surfaces of the two groove walls are reflecting surfaces; the open side of each of the two groove walls forms an opening of the concentrating groove; the opening direction of the front-side concentrating groove (110) is opposite to the opening direction of the back-side concentrating groove (110'). According to the double-sided concentrating solar device, sunlight (LL) can be concentrated and received from two different directions, thereby enhancing direction adaptability and expanding device mounting methods.

7 Claims, 4 Drawing Sheets

(58) Field of Classification Search
CPC .. F24S 23/31; F24S 23/74; F24S 23/77; F24S 2023/831; F24S 2023/834; F24S 2023/876; F24S 2023/872; F24S 2023/87
See application file for complete search history.

(56) References Cited

U.S. PATENT DOCUMENTS

| | | | | |
|---|---|---|---|---|
| 2009/0250093 A1* | 10/2009 | Chen | ............... | H01L 31/068 136/246 |
| 2009/0283144 A1* | 11/2009 | Hebrink | ............... | G02B 5/0841 136/259 |
| 2012/0160324 A1* | 6/2012 | Molnar | ............... | F24S 23/74 136/259 |

OTHER PUBLICATIONS

English machine translation of Guo et al. (CN 105978471) published on Sep. 28, 2016.*
English machine translation of Hu et al. (CN 206099878) published on Apr. 12, 2017.*
International Search Report of PCT Patent Application No. PCT/CN2018/085992 dated Feb. 11, 2019.

* cited by examiner

DOUBLE-SIDED LIGHT-CONCENTRATING SOLAR APPARATUS AND SYSTEM

TECHNICAL FIELD

The present disclosure relates to clean energy, in particular to double-sided light-concentrating solar apparatus.

BACKGROUND OF THE INVENTION

Solar energy systems have been widely used with the increasing demand for clean energy. Among them, light-concentrating solar systems with concentrating devices are particularly valued due to their high energy concentration.

Current light-concentrating solar systems primarily adopt a single-sided light-receiving method, that is, only receiving sunlight from one direction; accordingly, there are great restrictions when installing them. Moreover, their power generation time may also be limited if they are not used in conjunction with a sun-tracking system.

Therefore, it is necessary to study a light-concentrating solar system that is cost-effective and better adapted.

SUMMARY OF THE INVENTION

According to one aspect of the present disclosure, a double-sided light-concentrating solar apparatus may include a front-side light-concentrating groove, a back-side light-concentrating groove, and photovoltaic panel arranged at the bottom of each light-concentrating groove. Each light-concentrating groove includes two groove walls extending along the bottom thereof. The surfaces of the two groove walls facing each other are reflecting surfaces. The sides of the two groove walls opened form as the opening of the light-concentrating groove, and the lateral dimension of the opening being larger than that of the bottom. The opening direction of the front-side light-concentrating groove is opposite to the opening direction of the back-side light-concentrating groove.

According to different embodiments, the reflecting surface of the light-concentrating groove can be a common mirror surface, or a reflective Fresnel lens surface. The front-side light-concentrating groove and the back-side light-concentrating groove can be arranged in mirror symmetry and share the double-sided photovoltaic panel at the bottom. They may also be arranged back to back and offset by a predefined distance, or be arranged alternately to form a wavy concave-convex structure.

According to another aspect of the present disclosure, a double-sided light-concentrating solar system may include the aforesaid double-sided light-concentrating solar apparatus and a side reflective panel. The side reflective panel is arranged at a side of the double-sided light-concentrating solar apparatus. The reflecting surface of the side reflective panel is selected from: a flat surface, a folded surface, a curved surface, and a reflective Fresnel lens surface. The side reflective panel is configured to at least partially reflect the received sunlight into the opening of the front-side light-concentrating groove or the back-side light-concentrating groove of the double-sided light-concentrating solar apparatus.

With the double-sided light-concentrating solar apparatus according to the present disclosure, the sunlight can be received from two different directions, thereby enhancing the ability to adapt to directions and the installation methods of the apparatus. In addition, the double-sided light-concentrating solar can further cooperate with the reflective panel arranged on the periphery to form a solar system, which further enhances the light collection ability and improves the concentration ratio.

Specific examples according to the present disclosure are described in detail below with reference to the accompanying drawings. Terms that indicate a position, such as "upper", "lower", "front", "rear", "side", "top", "bottom" and the like, only refer to relative positional relationships, having no absolute meanings.

DETAILED DESCRIPTION

Embodiment 1

Figure 1:
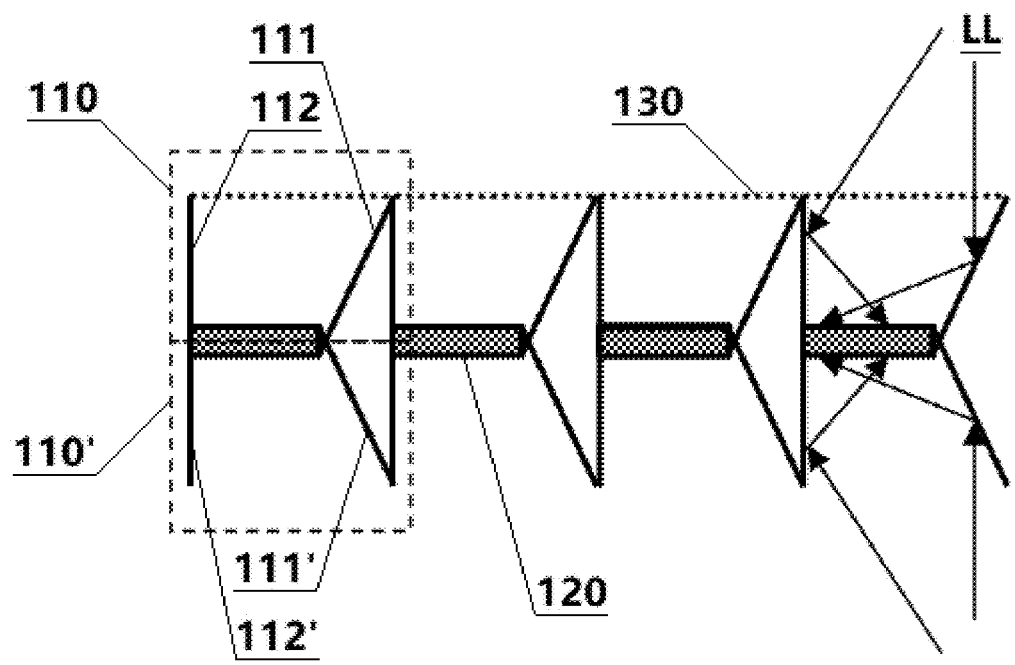
FIG. 1 is a schematic diagram of a double-sided light-concentrating solar apparatus according to Embodiment 1.

Referring to FIG. 1, one longitudinal section of a double-sided light-concentrating solar apparatus according to one embodiment of the present disclosure is shown, in which the longitudinal section is perpendicular to the photovoltaic panel of the apparatus. The apparatus includes a plurality of front-side light-concentrating grooves 110, a plurality of back-side light-concentrating grooves 110' and photovoltaic panel(s) 120. LL shown in the current and following figures represents sunlight whose light path is indicated by arrows.

Each front-side light-concentrating groove 110 includes two groove walls 111, 112 extended along the bottom thereof. The surfaces of the two groove walls facing each other are reflecting surfaces. The same sides of the two groove walls opened form as the opening of the light-concentrating groove, and the lateral dimension of the opening is larger than that of the bottom. Each back-side light-concentrating groove 110' has a structure similar to the one of the front-side light-concentrating groove, including two groove walls 111', 112' extended along the bottom thereof, except that the opening direction of the back-side light-concentrating groove is opposite to the opening direction of the front-side light-concentrating groove.

The reflecting surface of each (front-side or back side) light-concentrating groove is a smooth mirror in this embodiment; however, the reflecting surface of the light-concentrating groove may also be a reflective Fresnel lens surface in whole or in part in other embodiments. The reflective Fresnel lens refers to a Fresnel lens having a reflective film or a reflecting surface on its back, and the other surface thereof away from the reflecting surface is called the reflective Fresnel lens surface.

The front-side light-concentrating groove 110 and the back-side light-concentrating groove 110' are arranged in mirror symmetry and their bottoms are overlapped in this embodiment; accordingly, the photovoltaic panel 120 adopting a double-sided photovoltaic panel made of a double-sided bifacial solar cell can be arranged at the common bottom of the front-side light-concentrating groove 110 and the back-side light-concentrating groove 110' and be shared by them, thereby reducing the number of photovoltaic panels used. In this respect, the bottom can be free or made of a transparent material, so that the light concentrated by the front-side light-concentrating groove and the back-side light-concentrating groove are irradiated on one surface of the double-sided photovoltaic panel respectively. In other embodiments, the front-side light-concentrating groove and the back-side light-concentrating groove may be asymmetrical (for example, their groove walls may be inclined at different angles), or their bottoms may not be overlapped (such as being offset from each other) or the bottoms are standalone. Consequently, the photovoltaic panel arranged at the bottom of the each light-concentrating groove can be chosen according to whether it is required to receive light from double sides.

The included angles between the reflecting surfaces of the two groove walls of the light-concentrating groove and the bottom(s) are different (one is a right angle and the other is an obtuse angle) in this embodiment. The groove walls of the light-concentrating groove may also be symmetrical, that is, the included angles of the reflecting surfaces of the two groove walls and the bottom(s) are identical.

A transparent top cover 130 (shown in dotted lines in FIG. 1) arranged at the opening of the front-side light-concentrating groove 110 is further provided in this embodiment as a preferred embodiment. The transparent top cover 130 may simply be a smooth flat cover plate made of for example glass or plastic to keep out dust. The transparent top cover can also preferably adopt a Fresnel lens to further enhance light concentration ratio. The transparent top cover can also be arranged at the opening of the back-side light-concentrating groove in other embodiments. Alternatively, an end cap can be provided at one end of the front-side light-concentrating groove or the back-side light-concentrating groove. The end cap can be made of a transparent material, or the surface of the end cap facing the inner of the light-concentrating groove is a reflecting surface. Alternatively, end caps can be provided at both ends of the front-side or back-side light-concentrating groove, thereby forming a closed structure.

The usage of the photovoltaic panel(s) can be saved by sharing the photovoltaic panel(s) of the light-concentrating grooves of both front and back sides in this embodiment, which might, however, increase the requirement for heat dissipation. The light-concentrating grooves of both sides may each also adopt a single-sided photovoltaic panel and their bottoms may be made of metal with good heat dissipation to obtain a better heat dissipation.

Embodiment 2

Figure 2:
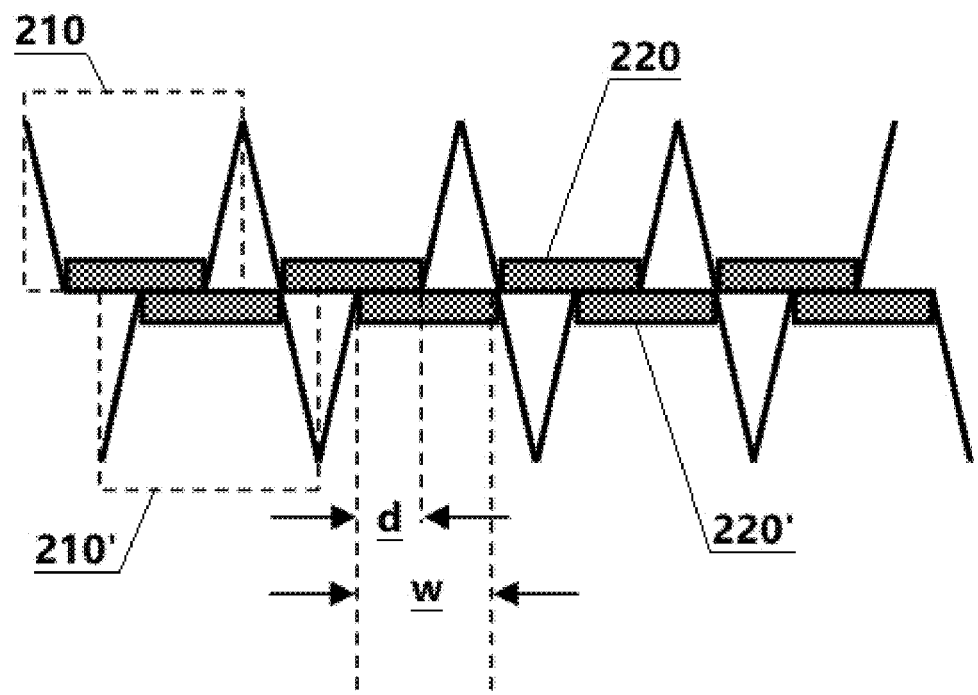
FIG. 2 is a schematic diagram of a double-sided light-concentrating solar apparatus according to Embodiment 2.

Referring to FIG. 2, one longitudinal section of a double-sided light-concentrating solar apparatus according to another embodiment of the present disclosure is shown, in which the longitudinal section is perpendicular to the photovoltaic panel of the apparatus. The apparatus includes a plurality of front-side light-concentrating grooves 210, a plurality of back-side light-concentrating grooves 210' and photovoltaic panels 220, 220' respectively arranged at the bottoms of the front-side light-concentrating grooves and the back-side light-concentrating grooves.

The difference between the light-concentrating groove in this embodiment and the one in Embodiment 1 is that the groove wall here is a symmetrical structure, that is, the included angles between the reflecting surfaces of the two groove walls and the bottoms are identical.

In addition, the bottoms of the front-side light-concentrating groove 210 and the back-side light-concentrating groove 210' are arranged on the same plane and are offset by a predefined distance d in this embodiment. In this respect, the photovoltaic panels 220, 220' can adopt single-sided photovoltaic panels respectively, and the photovoltaic panels on the front and back sides are also offset by the distance d.

The bottom of the light-concentrating groove can be made of an opaque metal material, and the distance d by which the bottoms are offset is preferably half of the width w of the bottom (i.e. the width of the photovoltaic panel 220, 220') in this embodiment as a preferred embodiment. Such design can effectively improve the heat dissipation of the apparatus.

Embodiment 3

Figure 3:
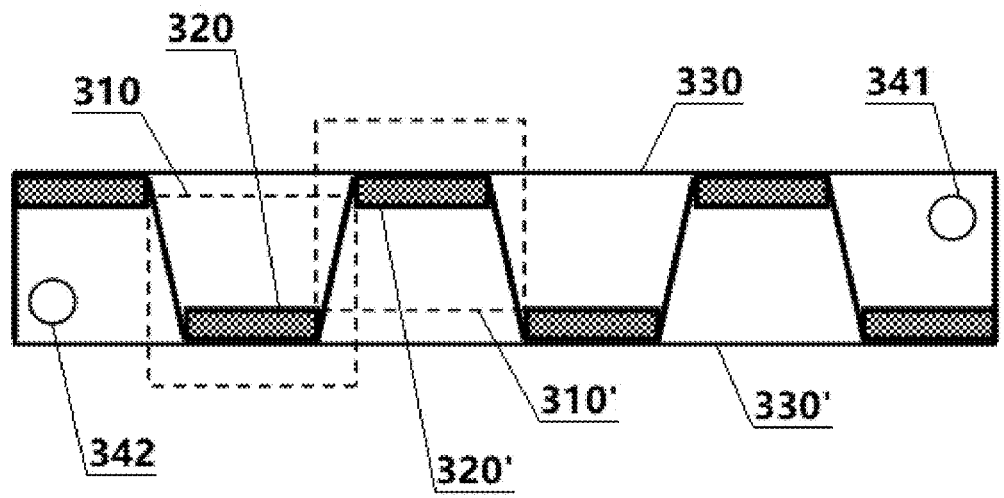
FIG. 3 is a schematic diagram of a double-sided light-concentrating solar apparatus according to Embodiment 3.

Referring to FIG. 3, one longitudinal section of a double-sided light-concentrating solar apparatus according to still another embodiment of the present disclosure is shown, in which the longitudinal section is perpendicular to the photovoltaic panel of the apparatus. The apparatus includes a plurality of front-side light-concentrating grooves 310, a plurality of back-side light-concentrating grooves 310', and photovoltaic panels 320, 320' respectively arranged at the bottoms of the front-side light-concentrating grooves and the back-side light-concentrating grooves.

The overall structures of the apparatus in Embodiments 1 and 2 are relatively thick since each of the front-side light-concentrating groove and the light-concentrating groove is formed as an individual layer and the bottoms thereof are on the same plane. However, the front-side light-concentrating groove and the back-side light-concentrating groove are arranged on the same layer in this embodiment; specifically, the opening of the front-side light-concentrating groove 310 and the bottom of the back-side light-concentrating groove 310' are on the same plane, the two kinds of light-concentrating grooves are arranged alternately, adjacent front-side light-concentrating groove and back-side light-concentrating groove share the same groove wall (making both sides of the groove wall are reflecting surfaces), forming a wavy concave-convex structure as a whole. Such arrangements greatly reduce the thickness of the double-sided light-concentrating solar apparatus.

Preferably, both the front-side light-concentrating groove and the back-side light-concentrating groove can partially adopt a reflective Fresnel lens surface in this embodiment, for example a reflective Fresnel lens surface is provided near the opening of the light-concentrating groove. In this respect, it can help to increase the light concentration ratio, thereby further reducing the thickness of the double-sided light-concentrating solar apparatus.

The bottom of each light-concentrating groove can be free or be made of transparent material, which enables the position where the photovoltaic panels 320, 320' locate to receive light on both sides. Accordingly, a double-sided photovoltaic panel can be preferably employed. Of course, a single-sided photovoltaic panel may also be adopted, that is, the photovoltaic panel only receives light from the opening of the light-concentrating groove where it is located.

Transparent top covers 330, 330' made of Fresnel lenses arranged at the openings of the front-side light-concentrating groove and the back-side light-concentrating groove respectively may also be provided in this embodiment as a preferred embodiment. Moreover, transparent or reflective end cap (not shown) are further arranged at both ends of the light-concentrating groove, so that all the photovoltaic panels and the reflecting surfaces are enclosed. A working fluid can be further provided in the closed front-side or back-side light-concentrating groove for heat dissipation or heat utilization. Preferably, the formed closed container may also be provided with pipe interfaces 341, 342 which can be connected to external pipes, so as to facilitate heat exchange with the outside through the flow of working fluid.

The double-sided light-concentrating solar apparatus according to the present disclosure can be used alone, or can be further combined with other apparatus to form a more advantageous solar system. Examples thereof are described below.

Embodiment 4

Figure 4:
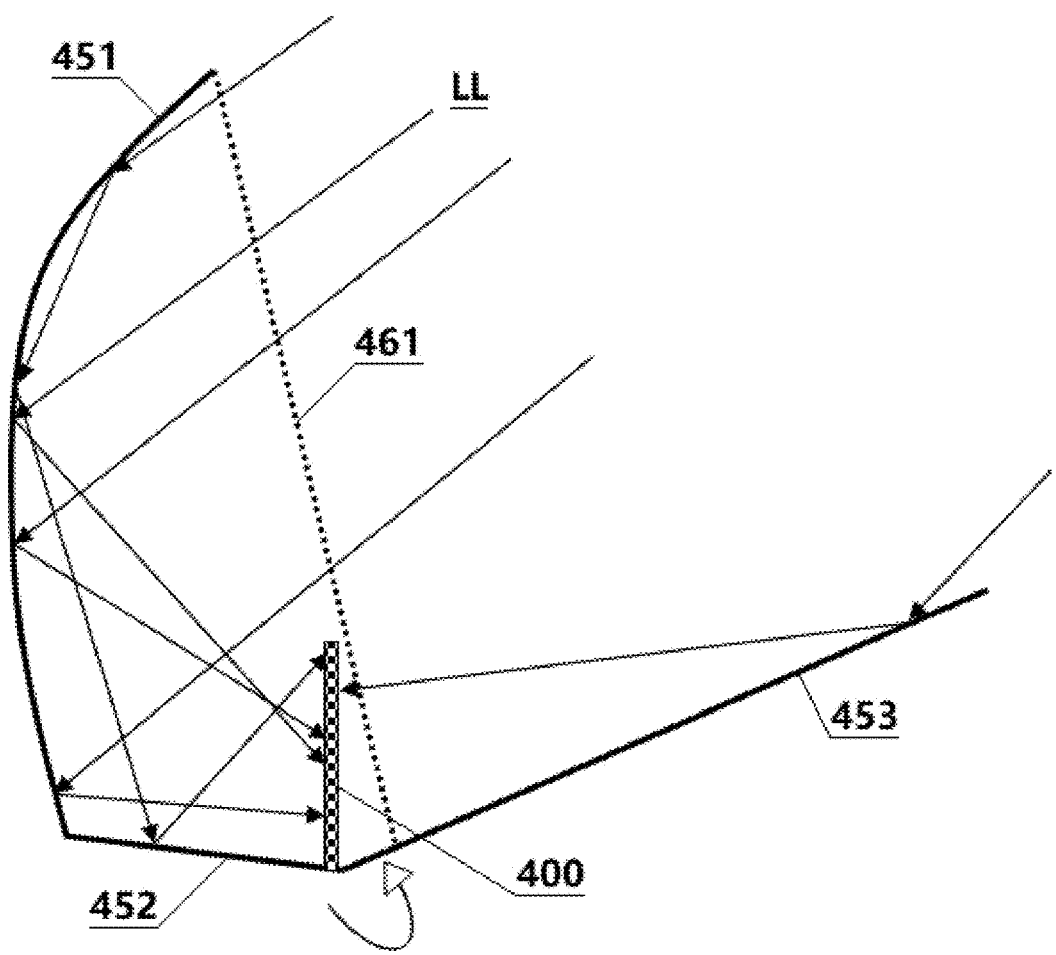
FIG. 4 is a schematic diagram of a double-sided light-concentrating solar system according to Embodiment 4.

Referring to FIG. 4, a double-sided light-concentrating solar system according to one embodiment of the present disclosure may include a double-sided light-concentrating solar apparatus 400 and a side reflective panel 451.

The double-sided light-concentrating solar apparatus 400 can adopt any structure according the present disclosure, such as the one described in the aforesaid Embodiments 1-3. It can act as a light energy utilization apparatus with double-sided light receiving capability.

The side reflective panel 451 is arranged on a side of the apparatus 400. The reflecting surface of the side reflective panel 451 is a curved surface in this embodiment; but it can also be a flat surface, a folded surface, or a reflective Fresnel lens surface in other embodiments. The side reflective panel is used to at least partially reflect the received sunlight into the opening of the front-side light-concentrating groove or the back-side light-concentrating groove of the apparatus 400. The apparatus 400 is arranged such that the photovoltaic panel therein is placed in a substantially vertical manner in this embodiment; and in other embodiment, the photovoltaic panel may also be placed relatively flat or inclined depending on the design of the installation and geographical environment of the system.

A bottom reflective panel 452 and a stretched-forward reflective panel 453 are further included in this embodiment as a preferred embodiment. The bottom reflective panel 452 is arranged under the apparatus 400 in a substantially horizontal or slightly inclined manner. The strentched-forward reflective panel 453 is extended forward from a side of the bottom reflective panel 452 away from the side reflective panel 451. The included angle between the strentched-forward reflective panel and the bottom reflective panel is an obtuse angle which may be constant or preferably be adjustable. That is, the connection between the strentched-forward reflective panel and the bottom reflective panel is made movable, so that the inclination angle of the strentched-forward reflective panel can be adjusted adaptively according to the seasonal angular changes of the sun.

In addition, the system of this embodiment can also be formed as a closed cavity by ambient covers including a transparent front cover 461 (shown by the dotted line in FIG. 4) arranged in front of the side reflective panel and end caps on both sides of the side reflective panel, thereby enclosing the reflecting surface of the side reflective panel, the reflecting surface of the bottom reflective panel and the apparatus 400 in the cavity.

Embodiment 5

Figure 5:
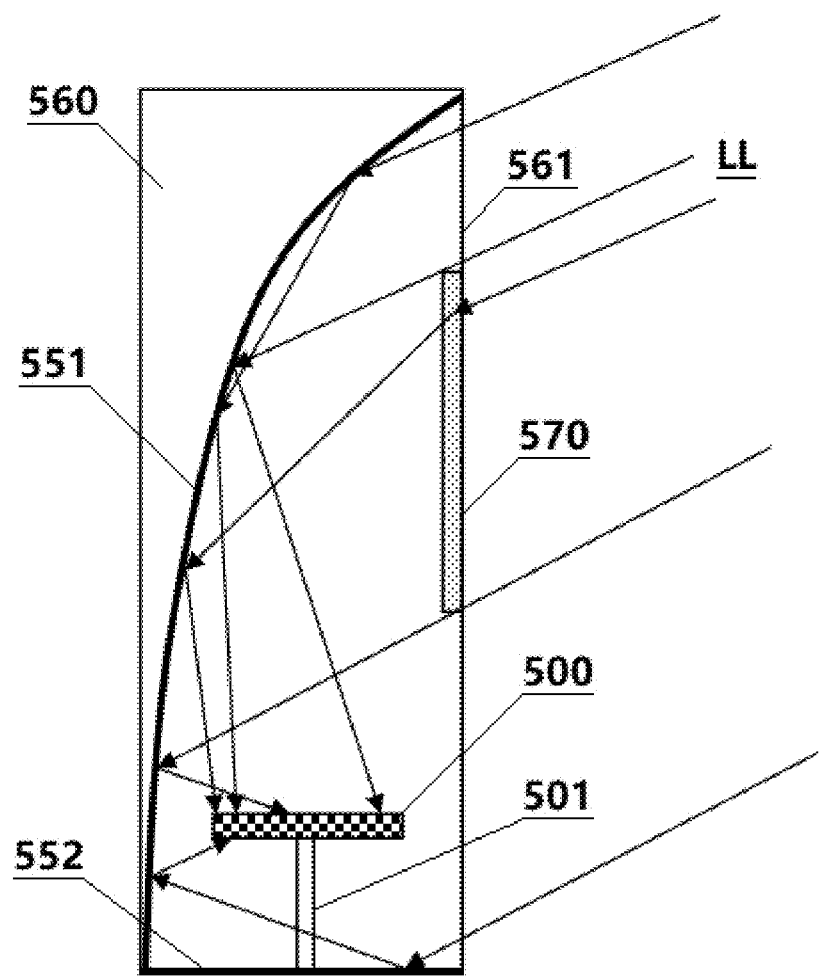
FIG. 5 is a schematic diagram of a double-sided light-concentrating solar system according to Embodiment 5.

Referring to FIG. 5, a double-sided light-concentrating solar system according to another embodiment of the present disclosure may include a double-sided light-concentrating solar apparatus 500, a side reflective panel 551 and a bottom reflective panel 552.

The system in this embodiment is a closed structure with the apparatus 500 and each reflective panel arranged in the cavity 560 formed by a plurality of ambient covers. At least the front cover 561 of the plurality of ambient covers is transparent.

The apparatus 500 is substantially horizontally supported on the bottom reflective panel 552 through a support formation 501. The side reflective panel 551 is arranged on one side of the apparatus 500.

A Fresnel lens 570 arranged on the optical path before the one the sunlight incident on the side reflective panel 551, specifically on the upper part of the front cover 561, is further included in this embodiment as a preferred embodiment. The Fresnel lens 570 selected from a linear Fresnel lens and a partial Fresnel lens can be used to deflect the sunlight downward to support light concentration ration. The so-called "linear Fresnel lens" means that the focal center of the lens is not a point but a line. The so-called "partial Fresnel lens" means that the tooth surface of the Fresnel lens is not a complete symmetrical pattern but only a part of it; for example, a partial Fresnel lens is formed by cutting a complete circular Fresnel lens at a position close to the diameter thereof.

Embodiment 6

Figure 6:
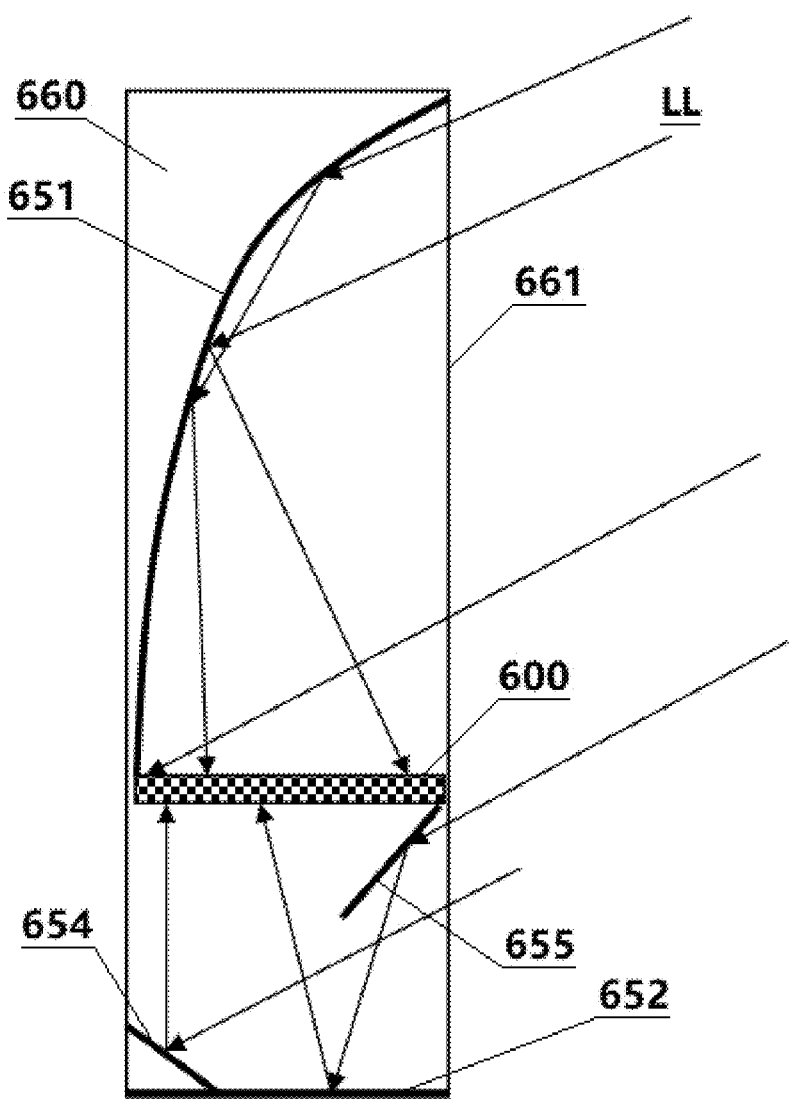
FIG. 6 is a schematic diagram of a double-sided light-concentrating solar system according to Embodiment 6.

Referring to FIG. 6, a double-sided light-concentrating solar system according to still another embodiment of the present disclosure may include a double-sided light-concentrating solar apparatus 600, a side reflective panel 651 and a bottom reflective panel 652.

The structure of this embodiment is similar to that of Embodiment 5, in which the entire structure is arranged in the cavity 660 except that no Fresnel lens is arranged on the transparent front cover 661 of the ambient covers.

Two auxiliary reflective panels 654, 655, which are respectively arranged above the bottom reflective panel 652, is further included in this embodiment as a preferred embodiment. The apparatus 600 is arranged such that the photovoltaic panel therein is placed in a substantially horizontal manner, and two auxiliary reflective panels are used to guide the light incident below the apparatus 600 directly or indirectly (via the bottom reflective panel 652) into the light-concentrating groove of the apparatus 600 with the opening facing downward.

This embodiment can be used as a basic unit of a solar wall, namely a solar brick.

The principle and implementation manners of the present disclosure has been described above with reference to specific embodiments, which are merely provided for the purpose of understanding the present disclosure and should not be construed as limiting the present disclosure. It will be possible for those skilled in the art to make variations based on the idea of the present disclosure.

The invention claimed is:
1. A double-sided light-concentrating solar apparatus, comprising:
 a front-side light-concentrating groove, a back-side light-concentrating groove, and photovoltaic panels arranged at bottoms of each light-concentrating groove,
 each light-concentrating groove comprising two groove walls extending from the bottom thereof, surfaces of the two groove walls facing each other being reflecting surfaces, the two groove walls forming an opening of the respective light-concentrating groove, a lateral dimension of the opening of each of the light-concentrating groove being larger . . . the bottom of each of the light-concentrating groove, and an opening direction of the front-side light-concentrating groove being opposite to an opening direction of the back-side light-concentrating groove, wherein the opening of the front-side light-concentrating groove and the bottom of the back-side light-concentrating groove are arranged on a same plane, the two light-concentrating grooves are arranged alternately, the front-side light-concentrating groove and the back-side light-concentrating groove share a same groove wall, forming a wavy concave-convex structure as a whole.

2. The solar apparatus according to claim 1, wherein at least a part of the reflecting surfaces of the two groove walls of the front-side light-concentrating groove or the back-side light-concentrating groove is a reflective Fresnel lens surface.

3. The solar apparatus according to claim 1, wherein angles between the reflecting surfaces of the two groove walls of the the front side light concentrating groove and/or the back side light concentrating groove and the bottom thereof are identical, or the angles between the reflecting surfaces of the two groove walls of the the front side light concentrating groove and/or the back side light concentrating groove and the bottom thereof are different, one of which is a right angle and the other one is an obtuse angle.

4. The solar apparatus according to claim 1, wherein the photovoltaic panels are double-sided photovoltaic panels, and the bottom of each light-concentrating groove is formed by one of the photovoltaic panels or made of a transparent material.

5. The solar apparatus according to claim 1, further comprising a transparent top cover, wherein the transparent top cover comprises a Fresnel lens arranged at the opening of the front-side light-concentrating groove or the back-side light-concentrating groove.

6. The solar apparatus according to claim 1, wherein the front-side light-concentrating groove or the back-side light-concentrating groove is formed to be a closed container with a working fluid provided therein, the closed container is further provided with a pipe interface which is able to connect to an external pipe.

7. The solar apparatus according to claim 1, further comprising an end cap, wherein the end cap is arranged at one end of the front-side light-concentrating groove or the back-side light-concentrating groove is made of a transparent material, or a surface of the end cap facing the front-side light-concentrating groove or the back-side light-concentrating groove is a reflecting surface.

* * * * *